United States Patent
Ding et al.

(10) Patent No.: US 10,818,226 B2
(45) Date of Patent: Oct. 27, 2020

(54) PIXEL CIRCUIT, METHOD FOR DRIVING THE SAME, AND DISPLAY APPARATUS

(71) Applicant: BOE Technology Group Co., Ltd., Beijing (CN)

(72) Inventors: Xiaoliang Ding, Beijing (CN); Haisheng Wang, Beijing (CN); Yingming Liu, Beijing (CN); Chunwei Wu, Beijing (CN); ChihJen Cheng, Beijing (CN); Pengpeng Wang, Beijing (CN); Wei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/072,878

(22) PCT Filed: Nov. 21, 2017

(86) PCT No.: PCT/CN2017/112137
§ 371 (c)(1),
(2) Date: Jul. 25, 2019

(87) PCT Pub. No.: WO2018/209917
PCT Pub. Date: Nov. 22, 2018

(65) Prior Publication Data
US 2019/0355302 A1 Nov. 21, 2019

(30) Foreign Application Priority Data
May 17, 2017 (CN) .......................... 2017 1 0350395

(51) Int. Cl.
*G09G 3/3233* (2016.01)
*G09G 3/3258* (2016.01)
(Continued)

(52) U.S. Cl.
CPC ......... *G09G 3/3233* (2013.01); *G09G 3/3258* (2013.01); *G09G 3/3266* (2013.01);
(Continued)

(58) Field of Classification Search
CPC .. G09G 3/3233; G09G 3/3258; G09G 3/3266; G09G 3/3275; G09G 2360/142;
(Continued)

(56) References Cited

U.S. PATENT DOCUMENTS

| 6,559,433 B1 | 5/2003 | Ozawa |
| 2003/0178551 A1 | 9/2003 | Ozawa |

(Continued)

FOREIGN PATENT DOCUMENTS

| CN | 1242904 A | 1/2000 |
| CN | 1619634 A | 5/2005 |

(Continued)

OTHER PUBLICATIONS

Office Action issued in corresponding Chinese Patent Application No. 201710350395.1, dated Mar. 20, 2018.
(Continued)

*Primary Examiner* — Carolyn R Edwards
(74) *Attorney, Agent, or Firm* — McDermott Will & Emery LLP

(57) ABSTRACT

Aspects of the present disclosure provide a pixel circuit, a method for driving the same, and a display apparatus. The pixel circuit comprises a display driving circuit. The display driving circuit comprises a reset sub-circuit, a writing sub-circuit, a driving sub-circuit, a light-emitting control sub-circuit, and a light-emitting device. The reset sub-circuit is configured to reset the driving sub-circuit. The writing sub-circuit is configured to write a data voltage into the driving sub-circuit. The light-emitting control sub-circuit is connected to the driving sub-circuit and an anode of the
(Continued)

light-emitting device and is configured to provide driving current, through the driving sub-circuit, for causing the light-emitting device to emit light. The pixel circuit further comprises a detection circuit configured to collect incident light and output a collection result to the read signal line. One or more transistors are shared between the detection circuit and the display driving circuit.

16 Claims, 7 Drawing Sheets

(51) Int. Cl.
     *G09G 3/3266*        (2016.01)
     *G09G 3/3275*        (2016.01)
     *H01L 27/146*        (2006.01)

(52) U.S. Cl.
     CPC ..... *G09G 3/3275* (2013.01); *H01L 27/14609*
              (2013.01); *H01L 27/14643* (2013.01)

(58) Field of Classification Search
     CPC ... G09G 2300/0861; G09G 2310/0251; G09G
          2310/0262; G09G 3/006; H01L 27/14609;
                                        H01L 27/14643
     See application file for complete search history.

(56) References Cited

U.S. PATENT DOCUMENTS

| | | |
|---|---|---|
| 2005/0104877 A1 | 5/2005 | Nakamura et al. |
| 2006/0267884 A1 | 11/2006 | Takahashi et al. |
| 2007/0024547 A1 | 2/2007 | Jang et al. |
| 2009/0243498 A1 | 10/2009 | Childs et al. |
| 2010/0149079 A1 | 6/2010 | Yamashita et al. |
| 2012/0176298 A1 | 7/2012 | Suh et al. |
| 2015/0103037 A1* | 4/2015 | Wu .......... G06F 3/044 345/174 |
| 2015/0268763 A1* | 9/2015 | Zhou .......... G09G 3/3208 345/174 |
| 2015/0301674 A1* | 10/2015 | Tan .......... H01L 27/3248 345/173 |
| 2015/0302801 A1* | 10/2015 | Tan .......... G06F 3/0416 345/173 |
| 2015/0356924 A1* | 12/2015 | Chen .......... G09G 3/3258 345/690 |
| 2016/0224157 A1 | 8/2016 | Yang |
| 2016/0291786 A1* | 10/2016 | Yokoi .......... G06F 3/044 |
| 2016/0365394 A1 | 12/2016 | Suh et al. |
| 2017/0154570 A1 | 6/2017 | Suh et al. |
| 2019/0279566 A1* | 9/2019 | Wang .......... H01L 27/3244 |

FOREIGN PATENT DOCUMENTS

| | | |
|---|---|---|
| CN | 1833268 A | 9/2006 |
| CN | 1870111 A | 11/2006 |
| CN | 101751846 A | 6/2010 |
| CN | 102385204 A | 3/2012 |
| CN | 102592514 A | 7/2012 |
| CN | 104091559 A | 10/2014 |
| CN | 106981268 A | 7/2017 |

OTHER PUBLICATIONS

International Search Report and Written Opinion issued in related International Patent Application No. PCT/CN2017/112137, dated Feb. 22, 2018.

* cited by examiner

PIXEL CIRCUIT, METHOD FOR DRIVING THE SAME, AND DISPLAY APPARATUS

CROSS-REFERENCE TO RELATED APPLICATION(S)

This application is a 371 National Stage application of International Application No. PCT/CN2017/112137, filed on Nov. 21, 2017, and claims priority to the Chinese Patent Application No. 201710350395.1, filed on May 17, 2017, the entire disclosures of which are hereby incorporated herein by reference.

TECHNICAL FIELD

The present disclosure relates to the field of display technologies, and more particularly, to a pixel circuit, a method for driving the same, and a display apparatus.

BACKGROUND

Active Matrix/Organic Light Emitting Diode (AMOLED) display apparatuses become the next generation of new flat panel displays. In order to realize a photographing function in an AMOLED display apparatus, a manufacturer who manufactures the display apparatus needs to separately purchase a component for realizing the photographing function, such as a camera, and mount the camera on the display apparatus. Typically, such a camera will occupy an area in the non-display region of the display apparatus, which is disadvantageous for narrow frame designing.

SUMMARY

The embodiments of the present disclosure provide a pixel circuit, a method for driving the same, and a display apparatus.

According to an aspect of the embodiments of the present disclosure, there is provided a pixel circuit, comprising: a display driving circuit comprising a reset sub-circuit, a writing sub-circuit, a driving sub-circuit, a light-emitting control sub-circuit, and a light-emitting device, wherein the reset sub-circuit is connected to the driving sub-circuit and is configured to reset the driving sub-circuit; the writing sub-circuit is connected to the driving sub-circuit and is configured to write a data voltage into the driving sub-circuit; and the light-emitting control sub-circuit is connected to the driving sub-circuit and an anode of the light-emitting device and is configured to provide driving current for causing the light-emitting device to emit light to the light-emitting device through the driving sub-circuit; and the pixel circuit further comprises: a detection circuit connected to a read signal line and configured to collect incident light and output a collection result to the read signal line, wherein one or more transistors are shared between the detection circuit and the display driving circuit.

In an example, the display driving circuit further comprises a compensation sub-circuit, wherein the compensation sub-circuit is connected to the driving sub-circuit and is configured to perform threshold voltage compensation on the driving sub-circuit.

In an example, the driving sub-circuit is further connected to a first power supply voltage terminal and a second transmission control signal terminal, and the driving sub-circuit comprises a driving transistor, a ninth transistor and a storage capacitor, wherein the driving transistor has a gate connected to one terminal of the storage capacitor, a first electrode connected to a second electrode of the ninth transistor, and a second electrode connected to the light-emitting control sub-circuit, and the driving transistor is a P-type transistor, the ninth transistor has a gate connected to the second transmission control signal terminal, and a first electrode connected to the first power supply voltage terminal, and the other terminal of the storage capacitor is connected to the writing sub-circuit; and the detection circuit is further connected to the first power supply voltage terminal, the anode of the light-emitting device, a first initial voltage terminal, a second reset signal terminal, a gate control signal terminal, a first transmission control signal terminal, and the second transmission control signal terminal, and the detection circuit comprises a first transistor, a light-sensitive control transistor, a third transistor, the driving transistor, the ninth transistor, and a photodiode, wherein the first transistor has a gate connected to the second reset signal terminal, a first electrode connected to the first initial voltage terminal, and a second electrode connected to the anode of the light-emitting device, the light-sensitive control transistor has a gate connected to the first transmission control signal terminal, a first electrode connected to an anode of the photodiode, and a second electrode connected to the gate of the driving transistor, the third transistor has a gate connected to the gate control signal terminal, a first electrode connected to the first electrode of the driving transistor, and a second electrode connected to the read signal line, and a cathode of the photodiode is connected to the first power supply voltage terminal, and a cathode of the light-emitting device is connected to a second power supply voltage terminal.

In an example, the reset sub-circuit is further connected to a second initial voltage terminal and a first reset signal terminal, and is configured to output a voltage at the second initial voltage terminal to the driving sub-circuit under the control of the first reset signal terminal, and the reset sub-circuit comprises a fifth transistor, wherein the fifth transistor has a gate connected to the first reset signal terminal, a first electrode connected to the gate of the driving transistor, and a second electrode connected to the second initial voltage terminal; and the detection circuit further comprises the fifth transistor.

In an example, the light-emitting control sub-circuit is further connected to a first enabling signal terminal, and the light-emitting control sub-circuit comprises a light-emitting control transistor, wherein the light-emitting control transistor has a gate connected to the first enabling signal terminal, a first electrode connected to the second electrode of the driving transistor, and a second electrode connected to the anode of the light-emitting device, and the light-emitting control transistor is an N-type transistor.

In an example, the light-emitting control sub-circuit is further connected to the first enabling signal terminal and a third enabling signal terminal, and the light-emitting control sub-circuit comprises a first light-emitting control transistor and a second light-emitting control transistor, wherein the first light-emitting control transistor has a gate connected to the third enabling signal terminal, a first electrode connected to the first enabling signal terminal, and a second electrode connected to a gate of the second light-emitting control transistor, the second light-emitting control transistor has a first electrode connected to the driving sub-circuit, and a second electrode connected to the anode of the light-emitting device; and the detection circuit is further connected to the first enabling signal terminal, the third enabling signal terminal, a second reset signal terminal, and a gate control signal terminal, and the detection circuit comprises a first transistor, the first light-emitting control transistor, a third transistor, the second light-emitting control transistor, and a photodiode, wherein the first transistor has a gate connected to the second reset signal terminal, a first electrode connected to the second electrode of the second light-emitting control transistor, and a second electrode connected to an anode of the photodiode, the third transistor has a gate connected to the gate control signal terminal, a first electrode connected to the driving sub-circuit, and a second electrode connected to the read signal line, the second light-emitting control transistor is a P-type transistor, a cathode of the photodiode is connected to the gate of the second light-emitting control transistor; and the cathode of the light-emitting device is connected to a second power supply voltage terminal.

In an example, the driving sub-circuit is further connected to a first power supply voltage terminal, and the driving sub-circuit comprises a driving transistor and a storage capacitor, wherein the driving transistor has a gate connected to one terminal of the storage capacitor, a first electrode connected to the first power supply voltage terminal, and a second electrode connected to the anode of the light-emitting device, and the driving transistor is a P-type transistor.

In an example, the reset sub-circuit is further connected to a second initial voltage terminal and a first reset signal terminal, and is configured to output a voltage at the second initial voltage terminal to the driving sub-circuit under the control of the first reset signal terminal, and the reset sub-circuit comprises a fifth transistor, wherein the fifth transistor has a gate connected to the first reset signal terminal, a first electrode connected to the driving transistor, and a second electrode connected to the second initial voltage terminal.

In an example, the writing sub-circuit is further connected to a scanning signal terminal and a data signal terminal, and is configured to output a data voltage provided by the data signal terminal to the driving sub-circuit under the control of the scanning signal terminal, and the writing sub-circuit comprises a sixth transistor and a seventh transistor, wherein the sixth transistor has a gate connected to the scanning signal terminal, a first electrode connected to the driving sub-circuit, and a second electrode connected to the data signal terminal, and the seventh transistor has a gate connected to the scanning signal terminal, and a first electrode and a second electrode both connected to the driving sub-circuit.

In an example, the compensation sub-circuit is further connected to a first power supply voltage terminal and a second enabling signal terminal, and is configured to output a voltage at the first power supply voltage terminal to the driving sub-circuit under the control of the second enabling signal terminal, and the compensation sub-circuit comprises an eighth transistor, wherein the eighth transistor has a gate connected to the second enabling signal terminal, a first electrode connected to the first power supply voltage terminal, and a second electrode connected to the driving sub-circuit.

According to another aspect of the present disclosure, there is provided a display apparatus comprising a sub-pixel array in a form of matrix, wherein each sub-pixel in the sub-pixel array has any of the above-mentioned pixel circuits provided therein.

According to yet another aspect of the present disclosure, there is provided a method for driving any of the pixel circuits described above, comprising: driving the pixel circuit in alternate display phase and photographing phase. The display phase comprises a reset sub-phase, a writing sub-phase, and a light-emitting sub-phase, and driving the pixel circuit through the display phase comprises: in the reset sub-phase, resetting, by the reset sub-circuit, the driving sub-circuit; in the writing sub-phase, writing, by the writing sub-circuit, a data voltage into the driving sub-circuit; and in the light-emitting sub-phase, providing, by the driving sub-circuit, driving current for causing the light-emitting device to emit light to the light-emitting device; and driving the pixel circuit through the photographing phase comprises: collecting, by the detection circuit, an incident light and outputting a collection result to the read signal line.

In an example, the display phase further comprises a compensation sub-phase between the writing sub-phase and the light-emitting sub-phase, and driving the pixel circuit through the display phase comprises: in the compensation sub-phase, performing, by the compensation sub-circuit, threshold voltage compensation on the driving sub-circuit.

In an example, when the driving sub-circuit comprises a driving transistor and a ninth transistor, the detection circuit comprises a first transistor, a light-sensitive control transistor, a third transistor, the driving transistor, the ninth transistor, a fifth transistor and a photodiode, and the light-emitting control sub-circuit comprises a light-emitting control transistor, driving the pixel circuit through the photographing phase comprises: in a first sub-phase of the photographing phase, turning on the fifth transistor under the control of the first reset signal terminal; turning on the light-sensitive control transistor under the control of the first transmission control signal terminal; and outputting a voltage at the second initial voltage terminal to an anode of the photodiode through the fifth transistor and the light-sensitive control transistor; in a second sub-phase of the photographing phase, maintaining the light-sensitive control transistor in a turn-on state, collecting, by the photodiode, an incident light, converting the collected optical signal into an electrical signal, and outputting the electrical signal to a gate of the driving transistor through the light-sensitive control transistor; and in a third sub-phase of the photographing phase, turning on the third transistor under the control of the gate control signal terminal, multiplexing the driving transistor as a source follower to amplify a signal at the gate of the driving transistor, and outputting the amplified signal to the read signal line through the third transistor. In the photographing phase, the first transistor is turned on under the control of the second reset signal terminal, a voltage at the first initial voltage terminal is output to a second electrode of the light-emitting control transistor and an anode of the light-emitting device, the light-emitting control transistor is turned on under the control of the first enabling signal terminal, and the ninth transistor is turned off under the control of the second transmission control signal terminal.

In an example, when the driving sub-circuit comprises a driving transistor, the light-emitting control sub-circuit comprises a first light-emitting control transistor and a second light-emitting control transistor, and the detection circuit comprises a first transistor, the first light-emitting control transistor, a third transistor, the second light-emitting control transistor and a photodiode, driving the pixel circuit through the photographing phase comprises: in a first sub-phase of the photographing phase, turning on the first light-emitting control transistor under the control of the third enabling signal terminal, and outputting a signal at the first enabling signal terminal to a cathode of the photodiode; in a second sub-phase of the photographing phase, collecting, by the photodiode, an incident light, converting the collected optical signal into an electrical signal, and outputting the electrical signal to a gate of the second light-emitting control transistor; and in a third sub-phase of the photographing phase, turning on the third transistor under the control of the gate control signal terminal, multiplexing the second light-emitting control transistor as a source follower to amplify a signal of the gate of the second light-emitting control transistor, and outputting the amplified signal to the read signal line through the third transistor. In the photographing phase, the driving transistor is turned on, and the first transistor is turned on under the control of the second reset signal terminal to turn off the light-emitting device.

BRIEF DESCRIPTION OF THE ACCOMPANYING DRAWINGS

In order to more clearly illustrate the technical solutions of the embodiments of the present disclosure, the accompanying drawings required to be used in the embodiments will be briefly described below. It is obvious that the accompanying drawings in the following description are only some embodiments of the present disclosure. Those of ordinary skill in the art can also obtain other accompanying drawings according to these accompanying drawings without any creative work.

DETAILED DESCRIPTION

The technical solutions in the embodiments of the present disclosure will be clearly and completely described below with reference to the accompanying drawings in the embodiments of the present disclosure. It is obvious that the described embodiments are only a part of the embodiments of the present disclosure, instead of all the embodiments. All other embodiments obtained by those of ordinary skill in the art based on the embodiments of the present disclosure without any creative work shall fall within the protection scope of the present disclosure.

Figure 1:
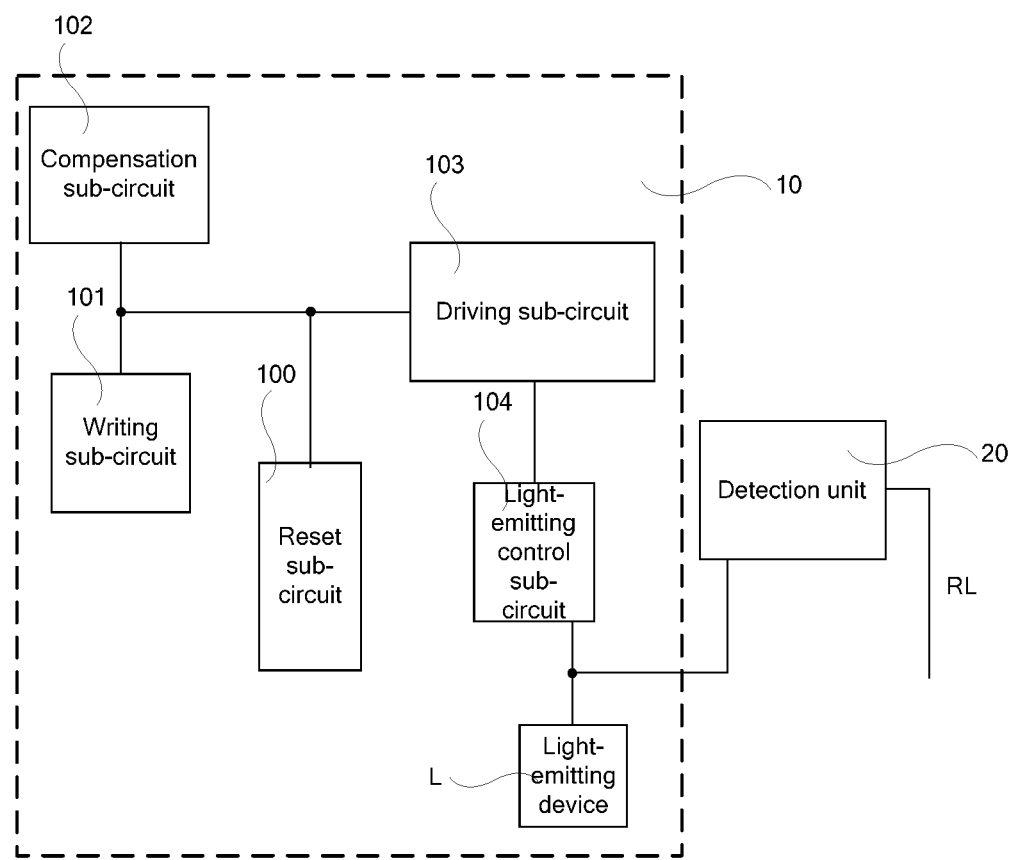
FIG. 1 is a schematic structural diagram of a pixel circuit according to an embodiment of the present disclosure.

The embodiments of the present disclosure provide a pixel circuit, which, as shown in FIG. 1, comprises a display driving circuit 10. The display driving circuit 10 comprises a reset sub-circuit 100, a writing sub-circuit 101, a compensation sub-circuit 102, a driving sub-circuit 103, a light-emitting control sub-circuit 104, and a light-emitting device L. Here, the light-emitting device L may be a Light Emitting Diode (LED) or an Organic Light Emitting Diode (OLED). Although the various sub-circuits described above are illustrated in the embodiment of FIG. 1, it can be understood by those skilled in the art that in some embodiments of the present disclosure, one or more of the sub-circuits, for example, the compensation sub-circuit 102, may not be included.

Based thereon, the reset sub-circuit 100 is connected to the driving sub-circuit 103. The reset sub-circuit 100 is configured to reset the driving sub-circuit 103.

The writing sub-circuit 101 is connected to the driving sub-circuit 103. The writing sub-circuit 101 is configured to write a data voltage Vdata into the driving sub-circuit 103.

The compensation sub-circuit 102 is connected to the driving sub-circuit 103. The compensation sub-circuit 102 is configured to compensate for a threshold voltage Vth of the driving sub-circuit 103.

The light-emitting control sub-circuit 104 is connected to the driving sub-circuit 103 and an anode of the light-emitting device L, and is configured to electrically connect the driving sub-circuit 103 to the light-emitting device L, so as to provide driving current to the light-emitting device L through the driving sub-circuit 103.

The light-emitting device L is configured to emit light according to the driving current. Here, when the driving current is large, brightness of the light emitted by the light-emitting device L is large, vice versa.

Based thereon, the pixel circuit further comprises a detection circuit 20 connected to a read signal line RL. Transistors are partly shared between the detection circuit 20 and the display driving circuit 10. The detection circuit 20 is configured to collect incident light and output a collection result to the read signal line RL.

Here, the read signal line RL is usually connected to an image processor. The image processor may receive the collection result of each detection circuit 20 through the read signal line RL, and integrate the collection result with a color block corresponding to a sub-pixel in which each detection circuit 20 is located to output the collected image data. Thereby, photographing of a picture is achieved.

It can be seen that, on the one hand, the pixel circuit comprises the display driving circuit 10, and the reset sub-circuit 100, the writing sub-circuit 101, the compensation sub-circuit 102, the driving sub-circuit 103, and the light-emitting control sub-circuit 104 in the display driving circuit 10 may be used to drive the light-emitting device L in the display driving circuit 10 to emit light, and the threshold voltage is compensated in a driving process, so that the driving current flowing through the light-emitting device L is independent of a threshold voltage of a driving transistor Md in the driving sub-circuit 103. Thereby, the influence of unevenness threshold voltages among various sub-pixels on the display brightness can be reduced. On the other hand, the pixel circuit further comprises the detection circuit 20, by which external light incident on each sub-pixel provided with the detection circuit 20 may be collected, thereby realizing an essential photosensitive element in the device having a photographing function. Therefore, in the present application, the detection circuit 20 is integrated into the pixel circuit, so that in a process of manufacturing a display panel, the photosensitive element of the device having a photographing function can be manufactured. The detection circuit 20 is located in the sub-pixel, and therefore there is no need to occupy the area of the non-display region, which is advantageous for the narrow frame. Based thereon, the transistors are partly shared between the detection circuit 20 and the display driving circuit, so that the structure of the pixel circuit having the detection circuit 20 integrated thereon can be simplified.

How the transistors are partly shared between the detection circuit 20 and the display driving circuit 10 will be described in detail below by way of example.

For example, in a case where transistors are partly shared between the detection circuit 20 and the driving sub-circuit 103, a connection manner and structures of various sub-circuits are as follows.

Figure 2:
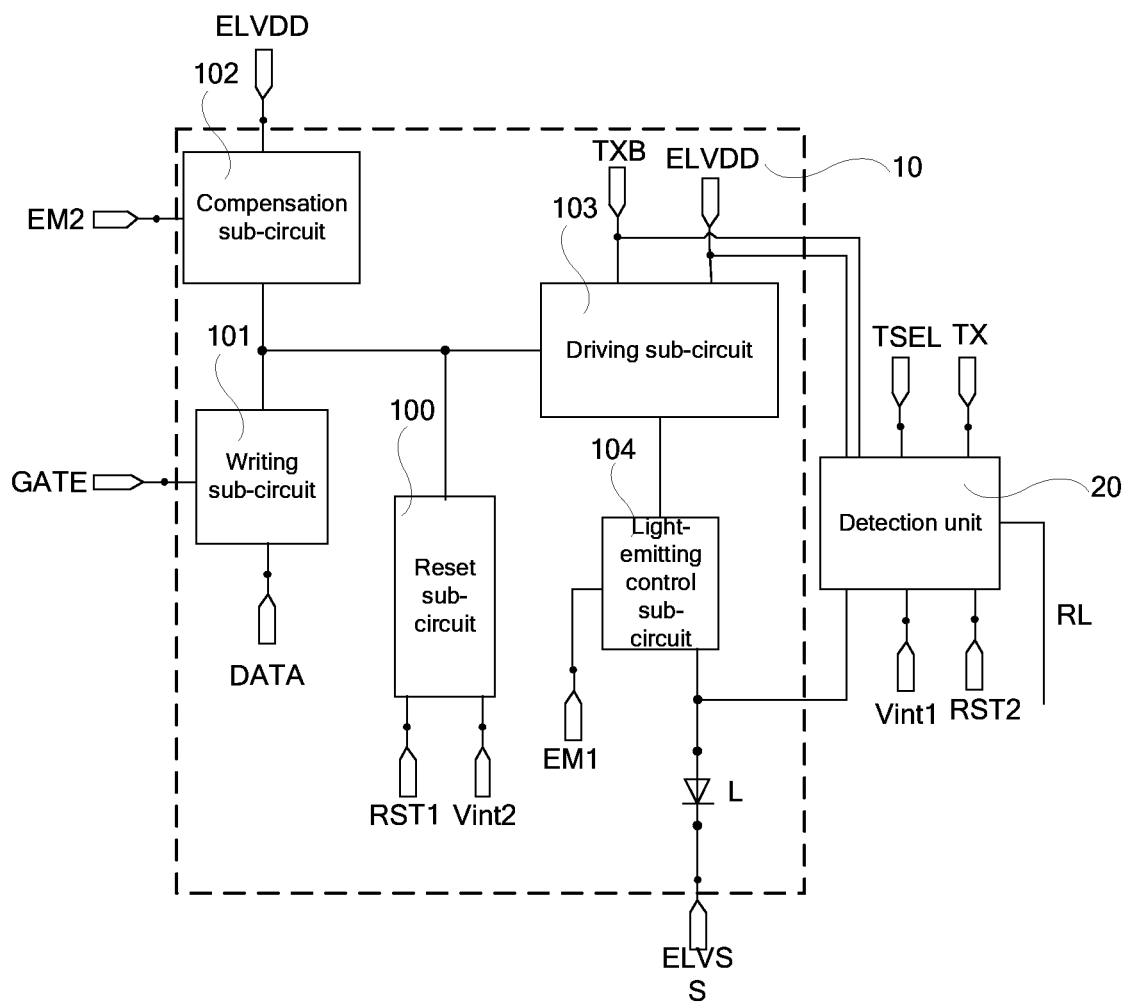
FIG. 2 is a specific connection structural diagram of various sub-circuits in FIG. 1.
Figure 3:
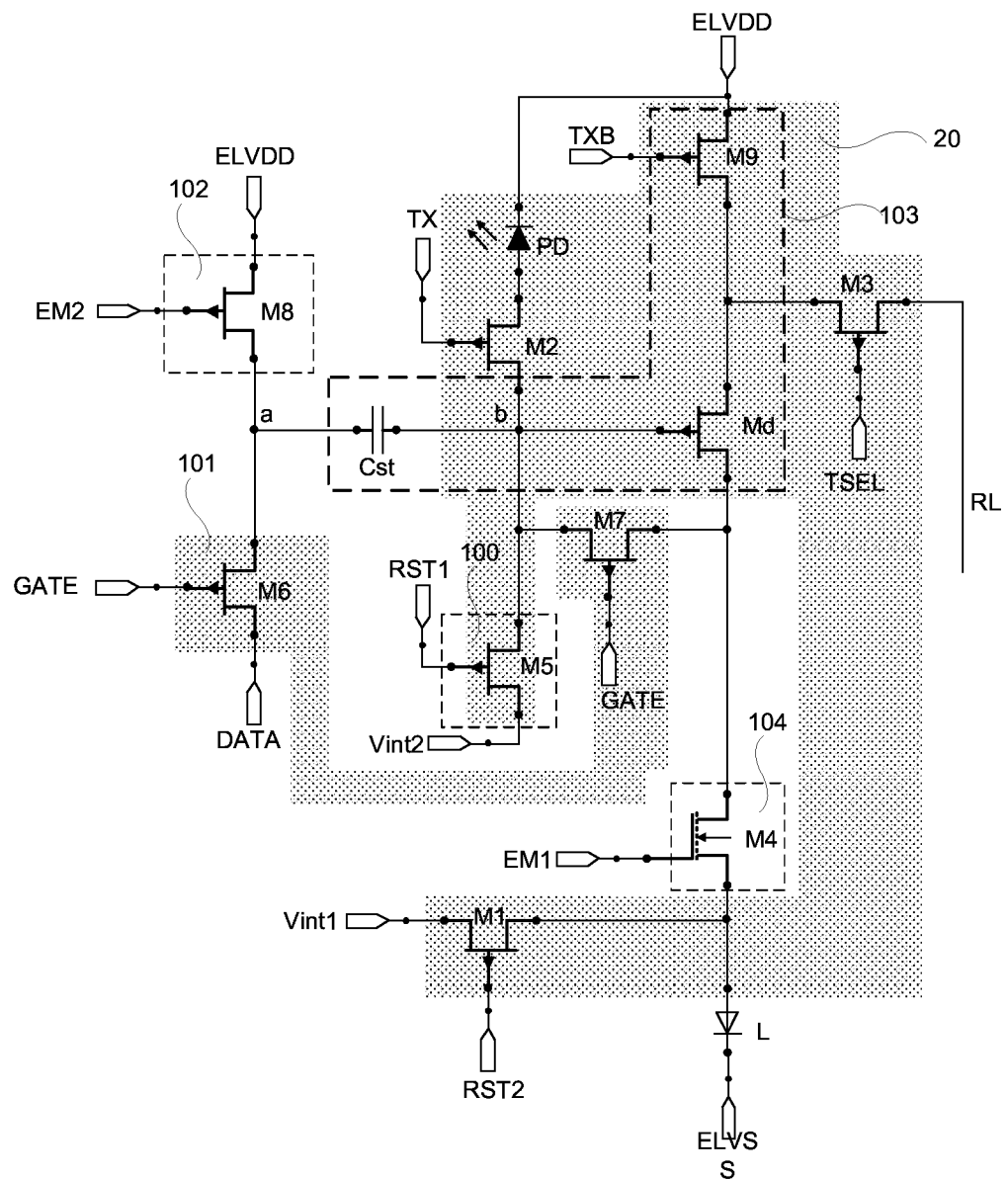
FIG. 3 is a specific structural diagram of various sub-circuits in FIG. 2.

Specifically, as shown in FIG. 2, the driving sub-circuit 103 is further connected to a first power supply voltage terminal ELVDD and a second transmission control signal terminal TXB. Based thereon, as shown in FIG. 3, the driving sub-circuit 103 comprises a driving transistor Md, a ninth transistor M9, and a storage capacitor Cst. The driving transistor Md has a gate connected to one terminal of the storage capacitor Cst, a first electrode connected to a second electrode of the ninth transistor M9, and a second electrode connected to the light-emitting control sub-circuit 104. Here, the driving transistor Md is a P-type transistor. In this case, the first electrode of the driving transistor Md is a source and the second electrode of the driving transistor is a drain.

Further, the other terminal of the storage capacitor Cst is connected to the compensation sub-circuit 102 and the writing sub-circuit 101.

As shown in FIG. 2, the detection circuit 20 is further connected to the first power supply voltage terminal ELVDD, the anode of the light-emitting device L, a first initial voltage terminal Vint1, a second reset signal terminal RST2, a gate control signal terminal TSEL, a first transmission control signal terminal TX and the second transmission control signal terminal TXB.

Here, as shown in FIG. 3, the detection circuit 20 comprises a first transistor M1, a light-sensitive control transistor M2, a third transistor M3, the driving transistor Md, the ninth transistor M9, and a photodiode PD. In this case, the driving transistor Md and the ninth transistor M9 are shared between the detection circuit 20 and the driving sub-circuit 103. Here, the driving transistor Md is large in size, and is configured to drive the light-emitting device L to emit light in a display phase, in addition to functioning as a switch. The ninth transistor M9 is small in size and functions only as a switch.

Specifically, the first transistor M1 has a gate connected to the second reset signal terminal RST2, a first electrode connected to the first initial voltage terminal Vint1, and a second electrode connected to the anode of the light-emitting device L.

The light-sensitive control transistor M2 has a gate connected to the first transmission control signal terminal TX, a first electrode connected to an anode of the photodiode PD, and a second electrode connected to the gate of the driving transistor Md.

The third transistor M3 has a gate connected to the gate control signal terminal TSET, a first electrode connected to the first electrode of the driving transistor Md, and a second electrode connected to the read signal line RL. In this case, in a photographing phase, as the first electrode, i.e., the source, of the driving transistor Md is connected to the read signal line RL through the third transistor M3, the driving transistor Md is a source follower to amplify a signal collected by the photodiode PD and then output the amplified signal to the read signal line RL.

A cathode of the photodiode PD is connected to the first power supply voltage terminal ELVDD, and a cathode of the light-emitting device L is connected to a second power supply voltage terminal ELVSS.

Based thereon, the transistors are partly shared between the detection circuit 20 and the reset sub-circuit 100.

In this case, the reset sub-circuit 100 is further connected to a second initial voltage terminal Vint2 and a first reset signal terminal RST1. The reset sub-circuit is configured to output a voltage at the second initial voltage terminal Vint2 to the driving sub-circuit 103 under the control of the first reset signal terminal RST1 to reset the driving sub-circuit 103.

Based thereon, as shown in FIG. 3, the reset sub-circuit 100 comprises a fifth transistor M5, wherein the fifth transistor M5 has a gate connected to the first reset signal terminal RST1, a first electrode connected to the gate of the driving transistor Md, and a second terminal connected to the second initial voltage terminal Vint2.

In this case, as shown in FIG. 3, the detection circuit 20 further comprises a fifth transistor M5. Therefore, the fifth transistor M5 is shared between the detection circuit 20 and the reset sub-circuit 100.

In addition, as shown in FIG. 2, the light-emitting control sub-circuit 104 is further connected to a first enabling signal terminal EM1. Specifically, as shown in FIG. 3, the light-emitting control sub-circuit 104 comprises a light-emitting control transistor M4. The light-emitting control transistor M4 has a gate connected to the first enabling signal terminal EM1, a first electrode connected to the second electrode of the driving transistor Md, and a second electrode connected to the anode of the light-emitting device L. Here, the light-emitting control transistor M4 is an N-type transistor. In this case, the first electrode of the light-emitting control transistor M4 is a drain and the second electrode of the light-emitting control transistor M4 is a source.

Further, as shown in FIG. 2, the writing sub-circuit 101 is further connected to a scanning signal terminal GATE and a data signal terminal DATA. The writing sub-circuit 101 is configured to output a data voltage provided by the data signal terminal DATA to the driving sub-circuit 103 under the control of the scanning signal terminal GATE.

Specifically, as shown in FIG. 3, the writing sub-circuit 101 comprises a sixth transistor M6 and a seventh transistor M7. Here, the sixth transistor M6 has a gate connected to the scanning signal terminal GATE, a first electrode connected to the driving sub-circuit 103, and a second electrode connected to the data signal terminal DATA. When the structure of the driving sub-circuit 103 is as described above, the first electrode of the sixth transistor M6 is connected to the other terminal of the storage capacitor Cst.

The seventh transistor M7 has a gate connected to the scanning signal terminal GATE, and a first electrode and a second electrode both connected to the driving sub-circuit 103. Here, when the structure of the driving sub-circuit 103 is as described above, the seventh transistor M7 has a first electrode connected to the second electrode of the driving transistor Md, and a second electrode connected to the gate of the driving transistor Md.

In addition, as shown in FIG. 2, the compensation sub-circuit 102 is further connected to the first power supply voltage terminal ELVDD and a second enabling signal terminal EM2. The compensation sub-circuit 102 is configured to output a voltage at the first power supply voltage terminal ELVDD to the driving sub-circuit 103 under the control of the second enabling signal terminal EM2.

Specifically, the compensation sub-circuit 102 comprises an eighth transistor M8. The eighth transistor M8 has a gate connected to the second enabling signal terminal EM2, a first electrode connected to the first power supply voltage terminal ELVDD, and a second electrode connected to the driving sub-circuit 103. Here, when the structure of the driving sub-circuit 103 is as described above, the second electrode of the eighth transistor M8 is connected to the other terminal of the storage capacitor Cst.

It should be illustrated that, when the structure of the pixel circuit is as shown in FIG. 3, in the pixel circuit, except that the driving transistor Md is a P-type transistor and the light-emitting control transistor M4 is an N-type transistor, the remaining transistors (M1, M2, M3, M5, M6, M7, M8 and M9) may all be N-type transistors or P-type transistors. In this case, when the remaining transistors are all N-type transistors, first electrodes of the remaining transistors are drains and second electrodes of the remaining transistors are sources. Alternatively, when the remaining transistors are all P-type transistors, the first electrodes of the remaining transistors are sources and the second electrodes of the remaining transistors are drains. For convenience of explanation, the present disclosure will be described below by way of example in which the remaining transistors (M1, M2, M3, M5, M6, M7, M8, and M9) are all P-type transistors.

Further, each of the transistors in FIG. 3 may be a Thin Film Transistor (TFT) or a field effect transistor, which is not limited in the present disclosure.

Figure 4:
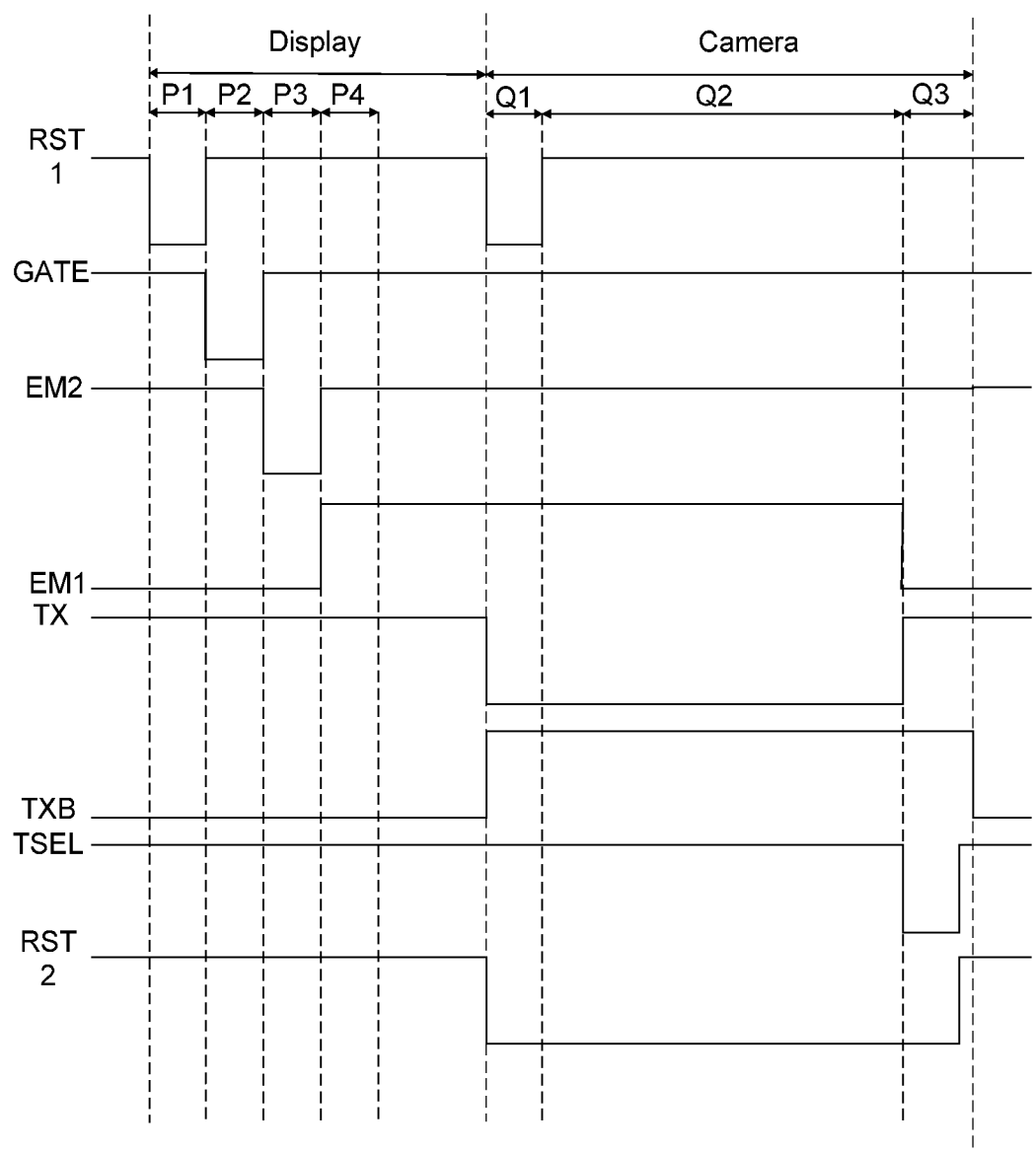
FIG. 4 is a timing diagram of various signals for controlling the pixel circuit shown in FIG. 3.

A method for driving the pixel circuit shown in FIG. 3 will be described in detail below in conjunction with a signal timing diagram shown in FIG. 4. Here, the first power supply voltage terminal ELVDD in FIG. 3 outputs a constant high level, and the second power supply voltage terminal ELVSS in FIG. 3 outputs a constant low level. Based thereon, a display panel having the pixel circuit can realize display and photographing. Therefore, a process of controlling the pixel circuit is as shown in FIG. 4, and comprises a plurality of image frames, i.e., a plurality of display phases (Display) and a photographing phase (Camera) inserted between adjacent two image frames.

Specifically, in a reset sub-phase P1 of the display phase, RST1=0; GATE=1; EM2=1; EM1=0; TX=1; TXB=0; TSEL=1; and RST2=1; wherein "0" is a low level, and "1" is a high level.

In this case, the second reset signal terminal RST1 outputs a low level, the fifth transistor M5 is turned on, and a voltage (for example, 0V) at the second initial voltage terminal Vint2 is output to the gate of the driving transistor Md through the fifth transistor M5. Thereby, the gate of the driving transistor Md is reset to remove residual charges at the gate of the driving transistor Md in a previous image frame, thereby preventing the residual charges from affecting the display in a next image frame.

In addition, the ninth transistor M9 is turned on, and the remaining transistors are all in a turn-off state.

Next, in a writing sub-phase P2 of the display phase, RST1=1; GATE=0; EM2=1; EM1=0; TX=1; TXB=0; TSEL=1; and RST2=1.

In this case, the sixth transistor M6 and the seventh transistor M7 are turned on. A data voltage (Vdata) input by the data signal terminal DATA is output to the other terminal of the storage capacitor Cst through the sixth transistor M6, and at this time, a voltage Va at a node a is equal to Vdata. At this time, under the discharge action of the storage capacitor Cst, the driving transistor Md is turned on, and as the seventh transistor M7 is turned on, the source of the driving transistor Md is connected to the gate of the driving transistor Md, so that the driving transistor Md is in a diode turn-on state, and at this time, a voltage Vb at a node b, i.e., a voltage Vg at the gate of the driving transistor Md is equal to VDD-Vth. Here, Vth is a threshold voltage of the driving transistor Md, and VDD is a voltage output by the first power supply voltage terminal ELVDD.

In addition, the ninth transistor M9 is turned on, and the remaining transistors are all in a turn-off state.

Next, in a compensation sub-phase P3 of the display phase, RST1=1; GATE=1; EM2=0; EM1=0; TX=1; TXB=0; TSEL=1; and RST2=1.

In this case, under the control of a low level output by the second enabling signal terminal EM2, the eighth transistor M8 is turned on, and a voltage (VDD) output by the first power supply voltage terminal ELVDD is output to the other terminal of the storage capacitor Cst through the eighth transistor M8, so that the voltage at the node a is VDD. At this time, a voltage change value $\Delta V$ at the node a is VDD-Vdata. Under the bootstrap action of the storage capacitor Cst, the voltage at one terminal of the storage capacitor Cst, i.e., the node b, becomes:

$$Vb = VDD - Vth + \Delta V$$
$$= VDD - Vth + VDD - Vdata$$
$$= 2 \times VDD - Vth - Vdata$$
$$= Vg.$$

In addition, the ninth transistor M9 is turned on, and the remaining transistors are all in a turn-off state.

Next, in a light-emitting sub-phase P4 of the display phase, RST1=1; GATE=1; EM2=1; EM1=1; TX=1; TXB=0; TSEL=1; and RST2=1.

Under the control of a high level output by the first enabling signal terminal EM1, the light-emitting control transistor M4 is turned on, and the driving transistor Md is also turned on, and under the control of the first power supply voltage terminal ELVDD and the second power supply voltage terminal ELVSS, the light-emitting device L, for example, an OLED, starts to emit light.

In this case, the second transmission control signal terminal TXB still controls the ninth transistor M9 to be turned on to output the voltage (VDD) at the first power supply voltage terminal ELVDD to the first electrode, i.e., the source of the driving transistor. At this time, as the driving transistor Md is a P-type transistor, a gate-source voltage Vgs of the driving transistor Md is:

$$Vgs = Vs - Vg$$
$$= VDD - (2 \times VDD - Vth - Vdata)$$
$$= Vdata + Vth - VDD.$$

Based thereon, driving current I flowing through the OLED is:

$$I = 1/2 \times (Vgs - Vth)^2 \quad (1)$$
$$= 1/2 \times ((Vdata + Vth - VDD) - Vth)^2$$
$$= 1/2 \times K(Vdata - VDD)^2.$$

where K is a current constant associated with the driving transistor Md, which is related to process parameters and geometric dimensions of the driving transistor Md.

It can be seen from the above formula (1) that the driving current I for driving the light-emitting device L to emit light is independent of a threshold voltage Vth of the driving transistor Md, so that a phenomenon in which various light-emitting devices L have uneven brightness due to a difference among the threshold voltages Vth of the driving transistors Md in the pixel circuits of various sub-pixels can be eliminated.

Based thereon, after the photographing phase (Camera) is inserted after the display phase (Display), turn-on and turn-off states of various transistors in the photographing phase (Camera) are as follows.

After entering the photographing phase (Camera), the second reset signal terminal RST2 is substantially maintained at a low level, so that the first transistor M1 is turned on. In this case, the voltage at the first initial voltage terminal Vint1 is output to the second electrode (i.e., the source) of the light-emitting control transistor M4 and the anode of the light-emitting device L through the first transistor M1. At this time, a magnitude of a voltage Vs at the source of the light-emitting control transistor M4 may be controlled by the first initial voltage terminal Vint1, so that the gate-source voltage Vgs of the light-emitting control transistor M4 can be controlled. Based thereon, the first enabling signal terminal EM1 controls the light-emitting control transistor M4 to be turned on, so that current flowing through the light-emitting control transistor M4 is maintained at a constant value to provide a constant current source to the driving transistor Md which is multiplexed as a source follower. In this way, the detection circuit 20 itself has a constant current source, and therefore there is no need to additionally provide a constant current source.

Further, a magnitude of the output voltage of the first initial voltage terminal Vint1 may further be controlled to control the light-emitting device L to be turned off in the photographing phase (Camera) or to be maintained in a light-emitting state to act as a light source. Based thereon, under the control of the second transmission control signal terminal TXB, the ninth transistor M9 is in a turn-off state.

Next, turn-on and turn-off states of the remaining transistors in the various sub-phases of the photographing phase will be described.

Specifically, in a first sub-phase Q1 of the photographing phase, RST1=0; GATE=1; EM2=1; EM1=1; TX=0; TXB=1; TSEL=1; and RST2=0.

In this case, under the control of the first reset signal terminal RST1, the fifth transistor M5 is turned on, and further, under the control of the first transmission control signal terminal TX, the light-sensitive control transistor M2 is turned on. The voltage at the second initial voltage terminal Vint2 is output to the anode of the photodiode PD through the fifth transistor M5 and the light-sensitive control transistor M2 to reset a voltage at the anode of the photodiode PD to prevent a residual voltage at the anode of the photodiode PD in a previous photographing phase from affecting a collection result in a next photographing phase.

In addition, in the detection circuit 20, except that the fifth transistor M5, the light-sensitive control transistor M2, and the first transistor M1 are turned on, the remaining transistors are all in a turn-off state.

Next, in a second sub-phase Q2 of the photographing phase, RST1=1; GATE=1; EM2=1; EM1=1; TX=0; TXB=1; TSEL=1; and RST2=0.

In this case, the light-sensitive control transistor M2 is still maintained in a turn-on state, and the photodiode PD collects the incident light, converts the collected optical signal into an electrical signal, and outputs the electrical signal to the gate of the driving transistor through the light-sensitive control transistor M2 to realize integration of photoelectric current.

In addition, in the detection circuit 20, except that the light-sensitive control transistor M2 and the first transistor M1 are turned on, the remaining transistors are all in a turn-off state.

Next, in a third sub-phase Q3 of the photographing phase, RST1=1; GATE=1; EM2=1; EM1=0; TX=1; TXB=1; TSEL=0; and RST2=0.

In this case, under the control of the gate control signal terminal TSEL, the third transistor M3 is turned on, and under the control of the output signal of the light-emitting diode PD, the driving transistor Md is turned on, so that the driving transistor Md is multiplexed as a source follower to amplify the signal at the gate of the driving transistor Md and output the amplified signal to the read signal line RL through the third transistor M3.

In addition, in the detection circuit 20, except that the third transistor M3, the driving transistor Md, and the first transistor M1 are turned on, the remaining transistors are all in a turn-off state.

It should be illustrated that, when the third sub-phase Q3 is about to end, voltages at the gate control signal terminal TSEL and the second reset signal terminal RST2 are raised to a high level to prepare for entering the display phase by the pixel circuit, thereby reducing the influence of this photographing phase on the display effect.

It can be seen that the light-sensitive control transistor M2, the third transistor M3, and the driving transistor Md in the detection circuit 20 form a three-Transistor Active Pixel Sensor (3T-APS).

Further, how the transistors are partly shared between the detection circuit 20 and the display driving circuit 10 is described above, and the transistors may be partly shared, for example, between the detection circuit 20 and the light-emitting control sub-circuit 104.

Figure 5:
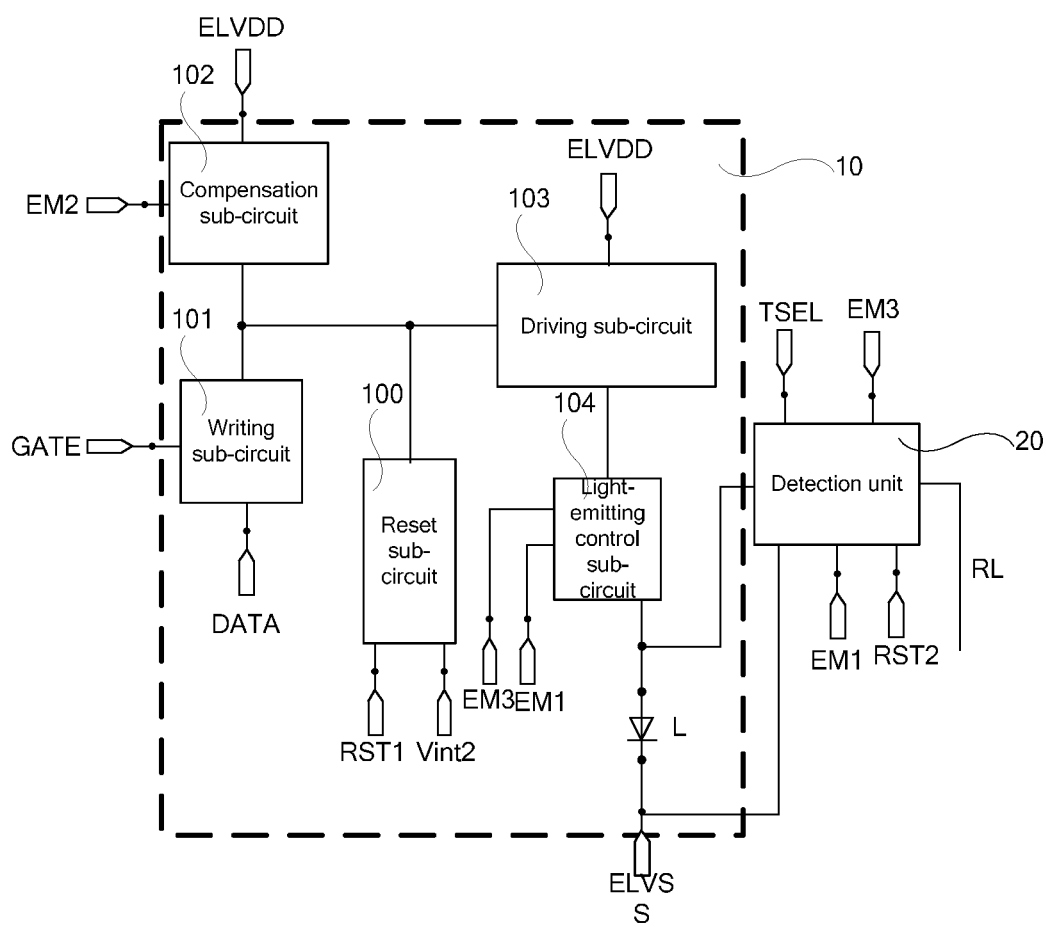
FIG. 5 is another specific connection structural diagram of various sub-circuits in FIG. 1.

In this case, as shown in FIG. 5, the light-emitting control sub-circuit 104 is further connected to the first enabling signal terminal EM1 and a third enabling signal terminal EM3.

Figure 6:
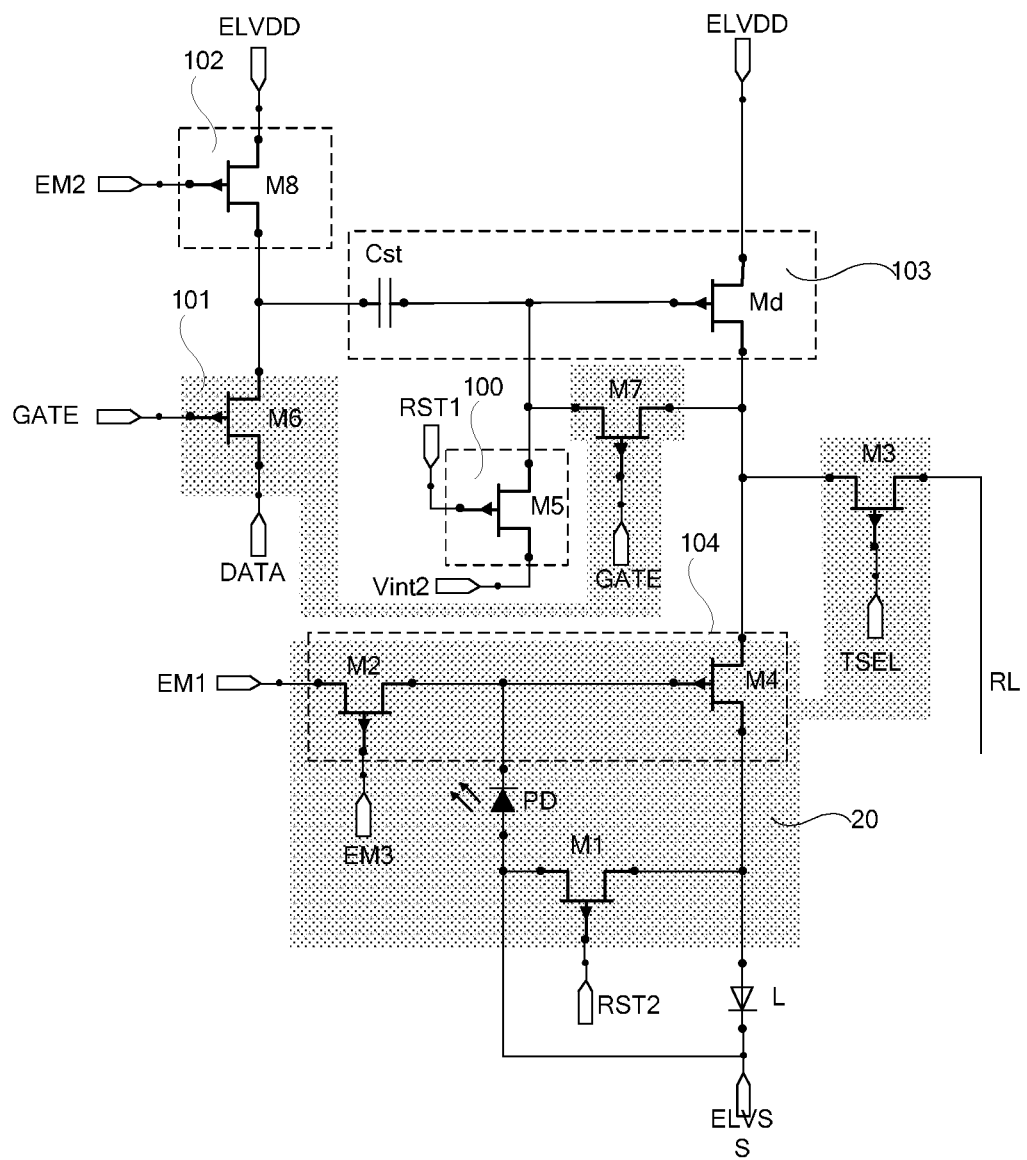
FIG. 6 is a specific structural diagram of various sub-circuits in FIG. 5.

Specifically, as shown in FIG. 6, the light-emitting control sub-circuit 104 comprises a first light-emitting control transistor M41 and a second light-emitting control transistor M42.

Here, the first light-emitting control transistor M41 has a gate connected to the third enabling signal terminal EM3, a first electrode connected to the first enabling signal terminal EM1, and a second electrode connected to a gate of the second light-emitting control transistor M42.

The second light-emitting control transistor M42 has a first electrode connected to the driving sub-circuit 103, and a second electrode connected to the anode of the light-emitting device L.

In addition, as shown in FIG. 5, the detection circuit 20 is further connected to the first enabling signal terminal EM1, the third enabling signal terminal EM3, a second reset signal terminal RST2, and a gate control signal terminal TSEL.

Specifically, as shown in FIG. 6, the detection circuit 20 comprises a first transistor M1, the first light-emitting control transistor M41, a third transistor M3, the second light-emitting control transistor M42, and a photodiode PD, wherein the second light-emitting control transistor M42 is a P-type transistor. Therefore, the second light-emitting control transistor M42 and the first light-emitting control transistor M41 are shared between the detection circuit 20 and the light-emitting controlling sub-circuit 104.

Here, the first transistor M1 has a gate connected to the second reset signal terminal RST2, a first electrode connected to a second electrode of the second light-emitting control transistor M42, and a second electrode connected to an anode of the photodiode PD.

The third transistor M3 has a gate connected to the gate control signal terminal TSEL, a first electrode connected to the driving sub-circuit 103, and a second electrode connected to the read signal line RL.

A cathode of the photodiode PD is connected to the gate of the second light-emitting control transistor M42, and a cathode of the light-emitting device L is connected to a second power supply voltage terminal ELVSS.

Based thereon, as shown in FIG. 5, the driving sub-circuit 104 is further connected to a first power supply voltage terminal ELVDD. Specifically, as shown in FIG. 6, the driving sub-circuit 103 comprises a driving transistor Md and a storage capacitor Cst. Here, the driving transistor Md has a gate connected to one terminal of the storage capacitor Cst, a first electrode connected to the first power supply voltage terminal ELVDD, and a second electrode connected to the anode of the light-emitting device L. The driving transistor Md is a P-type transistor.

It should be illustrated that when the structure of the detection circuit 20 is as described above, the first electrode (i.e., the source) of the second light-emitting control transistor M42 is connected to the second electrode of the driving transistor Md. Further, the first electrode of the third transistor M3 is connected to the first electrode (i.e., the source) of the second light-emitting control transistor M42. At this time, the second light-emitting control transistor M42 may be multiplexed as a source follower to amplify a signal collected by the photodiode PD, and output the amplified signal to the read signal line RL through the third transistor M3. Based thereon, in order to achieve a good amplification effect, the second light-emitting control transistor M42 may have a size comparable to that of the driving transistor Md.

In addition, the driving sub-circuit 104 may further comprise the ninth transistor M9 as shown in FIG. 3, and turn-on and turn-off states of the ninth transistor M9 in the display phase and the photographing phase are the same as those described above, and will not be described here again. For convenience of explanation, the following embodiments are described by taking the driving sub-circuit 104 shown in FIG. 6 as an example.

Based thereon, as shown in FIG. 5, the reset sub-circuit 100 is further connected to a second initial voltage terminal Vint2 and a first reset signal terminal RST1. The reset sub-circuit 100 is configured to output a voltage at the second initial voltage terminal Vint2 to the driving sub-circuit 103 under the control of the first reset signal terminal RST1.

Specifically, the reset sub-circuit 100 comprises a fifth transistor M5, wherein the fifth transistor M5 has a gate connected to the first reset signal terminal RST1, a first electrode connected to the driving transistor Md, and a second electrode connected to the second initial voltage terminal Vint2.

It should be illustrated that, in the pixel circuit shown in FIG. 6, except that the second light-emitting control transistor M42 and the driving transistor Md need to be P-type transistors, the remaining transistors may all be N-type transistors or P-type transistors. For convenience of explanation, the present disclosure will be described by way of example in which the remaining transistors are all P-type transistors.

Figure 7:
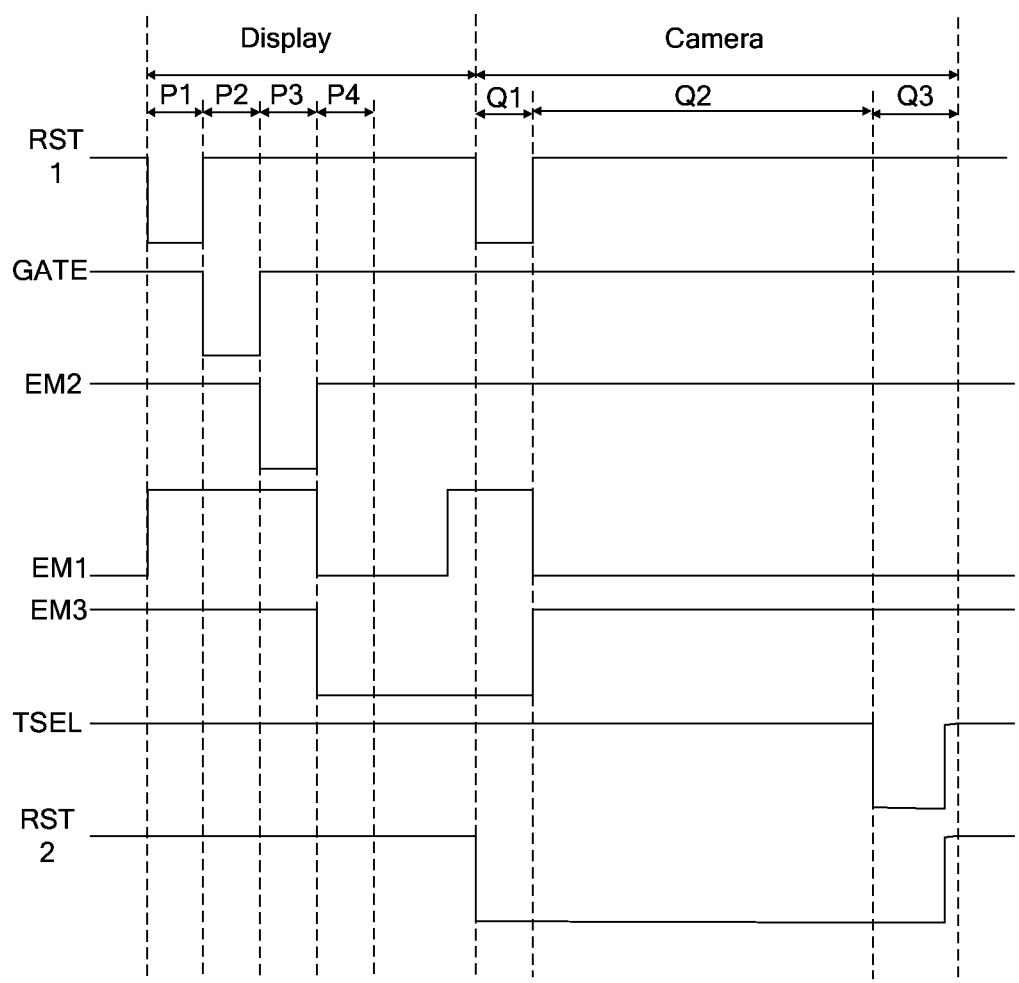
FIG. 7 is a timing diagram of various signals for controlling the pixel circuit shown in FIG. 6.

In this case, as shown in FIG. 7, the pixel circuit shown in FIG. 6 may also comprise display phases (Display) and a photographing phase inserted between adjacent two display phases. Here, a method for controlling the pixel circuit shown in FIG. 6 in the display phase has the same principle as that of the method for controlling the pixel circuit shown in FIG. 3, i.e., both comprising a reset sub-phase P1, a writing sub-phase P2, a compensation sub-phase P3, and a light-emitting sub-phase P4. Therefore, in various sub-phases, turn-on and turn-off states of each transistor will not be described here again. It should be understood by those skilled in the art that one or more of the above sub-phases, for example, the compensation sub-phase P3, may not be included in some embodiments.

The method for driving the pixel circuit shown in FIG. 6 in the photographing phase shown in FIG. 7 will be described below.

In the above photographing phase, under the action of capacitance of the driving transistor Md or the storage capacitor Cst, the driving transistor Md is maintained in a turn-on state, so that current flows through the driving transistor Md, to enable a constant current source to be provided to the second light-emitting control transistor M42 which is multiplexed as a source follower. In this way, the detection circuit 20 itself has a constant current source, and therefore there is no need to additionally provide a constant current source.

In addition, in this photographing phase, the second reset signal terminal RST2 outputs a low voltage, and controls the first transistor M1 to be turned on to electrically connect the anode and the cathode of the light-emitting device L to the second power supply voltage terminal ELVSS, and at this time, the light emitting device L is turned off.

Next, in various sub-phases of the photographing phase, the turn-on and turn-off states of the transistors are as follows.

In a first sub-phase of the photographing phase as shown in FIG. 7, RST1=0; GATE=1; EM2=1; EM1=1; EM3=0; TSEL=1; and RST2=0.

Under the control of the third enabling signal terminal EM3, the first light-emitting control transistor M41 is turned on, to output a high level at the first enabling signal terminal EM1 to the cathode of the photodiode PD, so that the voltage at the cathode of the photodiode PD is reset by the first enabling signal terminal EM1.

Further, in the detection circuit 20, except that the first transistor M1 and the first light-emitting control transistor M41 are turned on, the remaining transistors are in a turn-off state.

Next, in a second sub-phase Q2 of the photographing phase, RST1=1; GATE=1; EM2=1; EM1=0; EM3=1; TSEL=1; and RST2=0.

In this case, the photodiode PD collects incident light, converts the collected optical signal into an electrical signal and outputs the electrical signal to the gate of the second light-emitting control transistor M42 to perform integration of photoelectric current.

Further, in the detection circuit 20, except that the transistor M1, the first light-emitting control transistor M41, and the third transistor M3 are turned on, the remaining transistors are in a turn-off state.

Next, in a third sub-phase Q3 of the photographing phase, RST1=1; GATE=1; EM2=1; EM1=0; EM3=1; TSEL=0; and RST2=0.

Under the control of a low level at the gate control signal terminal TSEL, the third transistor M3 is turned on, and under the control of an output signal of the light-emitting diode PD, the second light-emitting control transistor M42 is turned on, so that the second light-emitting control transistor M42 is multiplexed as a source follower to amplify a signal at the gate of the second light-emitting control transistor M42 and output the amplified signal to the read signal line RL through the third transistor M3.

It can be seen that the first light-emitting control transistor M41, the third transistor M3, and the second light-emitting control transistor M42 in the detection circuit 20 form a 3T-APS.

In summary, the 3T-APS is integrated in the pixel circuits having a compensation function shown in FIGS. 3 and 6, and there is no need to additionally provide a current source to the 3T-APS when implementing the photographing function. Therefore, the circuit structure can be simplified and the cost can be reduced.

The embodiments of the present disclosure provide a display apparatus comprising a sub-pixel array in a form of matrix, wherein a sub-pixel in the sub-pixel array has any of the above-mentioned pixel circuits provided therein. The above display apparatus has the same structure and advantageous effects as those of the pixel circuit according to the embodiments described above, and will not be described here again.

It should be illustrated that, for example, the display apparatus may be any product or component having a display function, such as a display, a television, a digital photo frame, a mobile phone, or a tablet computer etc.

The embodiments of the present disclosure provide a method for driving any of the pixel circuits described above. The method comprises driving the pixel circuit through alternate display phase and photographing phase.

Here, the display phase (Display) comprises a reset sub-phase P1, a writing sub-phase P2, a compensation sub-phase P3 (optional), and a light-emitting sub-phase P4 as shown in FIG. 4 or FIG. 7.

Specifically, in the display phase, the method comprises the following steps.

In the reset sub-phase P1, the reset sub-circuit 100 resets the driving sub-circuit 103. When the structure of the pixel circuit is as shown in FIG. 3 or 6, a process in which the reset sub-circuit 100 resets the driving sub-circuit 103 is the same as that described above, and will not be described here again.

In the writing sub-phase P2, the writing sub-circuit 101 writes a data voltage Vdata into the driving sub-circuit 103. When the structure of the pixel circuit is as shown in FIG. 3 or 6, a writing process of the writing sub-circuit 101 is the same as that described above, and will not be described here again.

In the compensation sub-phase P3, the compensation sub-circuit 103 compensates for a threshold voltage Vth of the driving sub-circuit 103. When the structure of the pixel circuit is as shown in FIG. 3 or 6, a compensation process of the compensation sub-circuit 103 is the same as that described above, and will not be described here again.

In the light emitting sub-phase P4, the light emitting sub-circuit 104 electrically connects the driving sub-circuit 103 to the light-emitting device L, the driving sub-circuit 103 provides driving current to the light-emitting device L, and the light-emitting device L emits light according to the driving current. When the structure of the pixel circuit is as shown in FIG. 3 or 6, a light-emitting process of the light-emitting device L is the same as that described above, and will not be described here again.

In the photographing phase, the method comprises the following steps.

The detection circuit 20 collects incident light and outputs a collection result to the read signal line RL.

Here, for example, as shown in FIG. 3, when the driving sub-circuit 103 comprises a driving transistor Md and a ninth transistor M9, the detection circuit 20 comprises a first transistor M1, a light-sensitive control transistor M2, a third transistor M3, the driving transistor Md, the ninth transistor M9, a fifth transistor M5, and a photodiode PD, and the light-emitting control sub-circuit 104 comprises a light-emitting control transistor M4, the method for controlling the detection circuit 20 in the photographing phase is the same as that described above, and will not be described here again.

Alternatively, as another example, as shown in FIG. 6, when the driving sub-circuit comprises a driving transistor Md, the light-emitting control sub-circuit 104 comprises a first light-emitting control transistor M41 and a second light-emitting control transistor M42, and the detection circuit 20 comprises a first transistor M1, the first light-emitting control transistor M41, a third transistor M3, the second light-emitting control transistor M42, and a photodiode PD, the method for controlling the detection circuit 20 in the photographing phase is the same as that described above, and will not be described here again.

The embodiments of the present disclosure provide a pixel circuit, a method for driving the same, and a display apparatus. It can be seen that, on the one hand, the pixel circuit comprises the display driving circuit, and the reset sub-circuit, the writing sub-circuit, the compensation sub-circuit, the driving sub-circuit, and the light-emitting control sub-circuit in the display driving circuit may be used to drive the light-emitting device in the display driving circuit to emit light, and the threshold voltage is compensated in a driving process, so that the driving current flowing through the light-emitting device is independent of the threshold voltage of the driving transistor in the driving sub-circuit. Thereby, the influence of unevenness threshold voltages among various sub-pixels on the display brightness can be reduced. On the other hand, the pixel circuit further comprises a detection circuit, by which external light incident on each sub-pixel provided with the detection circuit may be collected, thereby realizing an essential photosensitive element in the device having a photographing function. Therefore, in the present application, the detection circuit is integrated into the pixel circuit, so that in the process of manufacturing a display panel, the photosensitive element of the device having a photographing function can be manufactured. The detection circuit is located in the sub-pixel, and therefore there is no need to occupy the area of the non-display region, which is advantageous for the narrow frame. Based thereon, the transistors are partly shared between the detection circuit and the display driving circuit, so that the structure of the pixel circuit having the detection circuit integrated thereon can be simplified.

It can be understood by those of ordinary skill in the art that all or a part of the steps for implementing the above method embodiments may be performed by programs instructing related hardware. The programs may be stored in a computer readable storage medium, and when executed, perform the steps including the method embodiments described above. The storage medium comprises a medium which may store program codes, such as a Read Only Memory (ROM), a Random Access Memory (RAM), a magnetic disk, or an optical disk etc.

The above description is only the specific embodiment of the present disclosure, but the protection scope of the present disclosure is not limited thereto. Changes or substitutions which can be easily reached by any person skilled in the art within the technical scope of the present disclosure should be covered within the protection scope of the present disclosure. Therefore, the protection scope of the present disclosure should be determined by the protection scope of the claims.

We claim:

1. A pixel circuit, comprising:
a display driving circuit comprising a driving sub-circuit and a light-emitting control sub-circuit, wherein
the light-emitting control sub-circuit is connected to the driving sub-circuit and an anode of a light-emitting device and is configured to provide driving current for causing the light-emitting device to emit light to the light-emitting device through the driving sub-circuit; and
the pixel circuit further comprises:
a detection circuit connected to a read signal line and configured to collect incident light and output a collection result to the read signal line, wherein one or more transistors are shared between the detection circuit and the display driving circuit,
wherein the detection circuit is electrically connected between a constant power supply voltage terminal and the anode of the light-emitting device,
wherein the constant power supply voltage terminal is a first power supply voltage terminal, the driving sub-circuit is further connected to the first power supply voltage terminal and a second transmission control signal terminal, and the driving sub-circuit comprises a driving transistor, a ninth transistor and a storage capacitor,
wherein the driving transistor has a gate connected to one terminal of the storage capacitor, a first electrode connected to a second electrode of the ninth transistor, and a second electrode connected to the light-emitting control sub-circuit, and the driving transistor is a P-type transistor,
the ninth transistor has a gate connected to the second transmission control signal terminal, and a first electrode connected to the first power supply voltage terminal, and
the other terminal of the storage capacitor is configured to receive a data voltage; and
the detection circuit is further connected to a first initial voltage terminal, a second reset signal terminal, a gate control signal terminal, a first transmission control signal terminal, and the second transmission control signal terminal, and the detection circuit comprises a first transistor, a light-sensitive control transistor, a third transistor, the driving transistor, the ninth transistor, and a photodiode, wherein
the first transistor has a gate connected to the second reset signal terminal, a first electrode connected to the first initial voltage terminal, and a second electrode connected to the anode of the light-emitting device,
the light-sensitive control transistor has a gate connected to the first transmission control signal terminal, a first electrode connected to an anode of the photodiode, and a second electrode connected to the gate of the driving transistor,
the third transistor has a gate connected to the gate control signal terminal, a first electrode connected to the first electrode of the driving transistor, and a second electrode connected to the read signal line, and
a cathode of the photodiode is connected to the first power supply voltage terminal, and a cathode of the light-emitting device is connected to a second power supply voltage terminal.

2. The pixel circuit according to claim 1, further comprising: a reset sub-circuit connected to the driving sub-circuit and configured to reset the driving sub-circuit,
wherein the reset sub-circuit is further connected to a second initial voltage terminal and a first reset signal terminal, and is configured to output a voltage at the second initial voltage terminal to the driving sub-circuit under the control of the first reset signal terminal, and the reset sub-circuit comprises a fifth transistor,
wherein the fifth transistor has a gate connected to the first reset signal terminal, a first electrode connected to the gate of the driving transistor, and a second electrode connected to the second initial voltage terminal; and
the detection circuit further comprises the fifth transistor.

3. The pixel circuit according to claim 1, wherein
the light-emitting control sub-circuit is further connected to a first enabling signal terminal, and the light-emitting control sub-circuit comprises a light-emitting control transistor,
wherein the light-emitting control transistor has a gate connected to the first enabling signal terminal, a first electrode connected to the second electrode of the driving transistor, and a second electrode connected to the anode of the light-emitting device, and the light-emitting control transistor is an N-type transistor.

4. The pixel circuit according to claim 3, wherein the constant power supply voltage terminal is a second power supply voltage terminal,
the light-emitting control sub-circuit is further connected to the first enabling signal terminal and a third enabling signal terminal, and the light-emitting control sub-circuit comprises a first light-emitting control transistor and a second light-emitting control transistor,
wherein the first light-emitting control transistor has a gate connected to the third enabling signal terminal, a first electrode connected to the first enabling signal terminal, and a second electrode connected to a gate of the second light-emitting control transistor,
the second light-emitting control transistor has a first electrode connected to the driving sub-circuit, and a second electrode connected to the anode of the light-emitting device; and
the detection circuit is further connected to the first enabling signal terminal, the third enabling signal terminal, a second reset signal terminal, and a gate control signal terminal, and the detection circuit comprises a first transistor, the first light-emitting control transistor, a third transistor, the second light-emitting control transistor, and a photodiode,
wherein the first transistor has a gate connected to the second reset signal terminal, a first electrode connected to the second electrode of the second light-emitting control transistor, and a second electrode connected to an anode of the photodiode,
the third transistor has a gate connected to the gate control signal terminal, a first electrode connected to the driving sub-circuit, and a second electrode connected to the read signal line,
the second light-emitting control transistor is a P-type transistor,
a cathode of the photodiode is connected to the gate of the second light-emitting control transistor, and the anode of the photodiode, and the cathode of the light-emitting device are commonly connected to the second power supply voltage terminal.

5. The pixel circuit according to claim 4, wherein
the driving sub-circuit is further connected to a first power supply voltage terminal, and the driving sub-circuit comprises a driving transistor and a storage capacitor, and
wherein the driving transistor has a gate connected to one terminal of the storage capacitor, a first electrode connected to the first power supply voltage terminal, and a second electrode connected to the anode of the light-emitting device, and the driving transistor is a P-type transistor.

6. The pixel circuit according to claim 5, further comprising:
a reset sub-circuit connected to the driving sub-circuit and configured to reset the driving sub-circuit,
wherein the reset sub-circuit is further connected to a second initial voltage terminal and a first reset signal terminal, and is configured to output a voltage at the second initial voltage terminal to the driving sub-circuit under the control of the first reset signal terminal, and the reset sub-circuit comprises a fifth transistor, and
wherein the fifth transistor has a gate connected to the first reset signal terminal, a first electrode connected to the driving transistor, and a second electrode connected to the second initial voltage terminal.

7. The pixel circuit according to claim 1, further comprising: a writing sub-circuit connected to the driving sub-circuit and configured to write a data voltage into the driving sub-circuit,
wherein the writing sub-circuit is further connected to a scanning signal terminal and a data signal terminal, and is configured to output a data voltage provided by the data signal terminal to the driving sub-circuit under the control of the scanning signal terminal, and the writing sub-circuit comprises a sixth transistor and a seventh transistor,
wherein the sixth transistor has a gate connected to the scanning signal terminal, a first electrode connected to the driving sub-circuit, and a second electrode connected to the data signal terminal, and
the seventh transistor has a gate connected to the scanning signal terminal, and a first electrode and a second electrode both connected to the driving sub-circuit.

8. The pixel circuit according to claim 1, wherein the display driving unit further comprises a compensation sub-circuit, and
wherein the compensation sub-circuit is connected to the driving sub-circuit and is configured to perform threshold voltage compensation on the driving sub-circuit.

9. A display apparatus comprising a sub-pixel array in a form of matrix, wherein a pixel circuit according to claim 1 is provided in each sub-pixel in the sub-pixel array.

10. A method for driving the pixel circuit according to claim 1, comprising:
driving the pixel circuit in alternate display phase and photographing phase, wherein
the display phase comprises a reset sub-phase, a writing sub-phase, and a light-emitting sub-phase, and driving the pixel circuit through the display phase comprises:
in the reset sub-phase, resetting, by the reset sub-circuit, the driving sub-circuit;
in the writing sub-phase, writing, by the writing sub-circuit, a data voltage into the driving sub-circuit; and
in the light-emitting sub-phase, providing, by the driving sub-circuit, driving current for causing the light-emitting device to emit light to the light-emitting device; and driving the pixel circuit through the photographing phase comprises:
collecting, by the detection circuit, an incident light and outputting a collection result to the read signal line.

11. The method according to claim 10, wherein the display phase further comprises a compensation sub-phase between the writing sub-phase and the light-emitting sub-phase, and driving the pixel circuit through the display phase comprises:
in the compensation sub-phase, performing, by the compensation sub-circuit, threshold voltage compensation on the driving sub-circuit.

12. The method according to claim 10, wherein when the driving sub-circuit comprises a driving transistor and a ninth transistor, the detection circuit comprises a first transistor, a light-sensitive control transistor, a third transistor, the driving transistor, the ninth transistor, a fifth transistor and a photodiode, and the light-emitting control sub-circuit comprises a light-emitting control transistor, driving the pixel circuit through the photographing phase comprises:
in a first sub-phase of the photographing phase, turning on the fifth transistor under the control of the first reset signal terminal; turning on the light-sensitive control transistor under the control of the first transmission control signal terminal; and outputting a voltage at the second initial voltage terminal to an anode of the photodiode through the fifth transistor and the light-sensitive control transistor;
in a second sub-phase of the photographing phase, maintaining the light-sensitive control transistor in a turn-on state, collecting, by the photodiode, an incident light, converting the collected optical signal into an electrical signal, and outputting the electrical signal to a gate of the driving transistor through the light-sensitive control transistor; and
in a third sub-phase of the photographing phase, turning on the third transistor under the control of the gate control signal terminal, multiplexing the driving transistor as a source follower to amplify a signal at the gate of the driving transistor, and outputting the amplified signal to the read signal line through the third transistor,
wherein in the photographing phase, the first transistor is turned on under the control of the second reset signal terminal, a voltage at the first initial voltage terminal is output to a second electrode of the light-emitting control transistor and an anode of the light-emitting device, the light-emitting control transistor is turned on under the control of the first enabling signal terminal, and the ninth transistor is turned off under the control of the second transmission control signal terminal.

13. The method according to claim 10, wherein when the driving sub-circuit comprises a driving transistor, the light-emitting control sub-circuit comprises a first light-emitting control transistor and a second light-emitting control transistor, and the detection circuit comprises a first transistor, the first light-emitting control transistor, a third transistor, the second light-emitting control transistor and a photodiode, driving the pixel circuit through the photographing phase comprises:
in a first sub-phase of the photographing phase, turning on the first light-emitting control transistor under the control of the third enabling signal terminal, and outputting a signal at the first enabling signal terminal to a cathode of the photodiode;
in a second sub-phase of the photographing phase, collecting, by the photodiode, an incident light, converting the collected optical signal into an electrical signal, and outputting the electrical signal to a gate of the second light-emitting control transistor; and in a third sub-phase of the photographing phase, turning on the third transistor under the control of the gate control signal terminal, multiplexing the second light-emitting control transistor as a source follower to amplify a signal of the gate of the second light-emitting control transistor, and outputting the amplified signal to the read signal line through the third transistor, wherein in the photographing phase, the driving transistor is turned on, and the first transistor is turned on under the control of the second reset signal terminal to turn off the light-emitting device.

14. The pixel circuit according to claim 1, wherein the pixel circuit is incorporated into a display apparatus comprising a sub-pixel array in a form of matrix, and wherein the pixel circuit is provided in each sub-pixel in the sub-pixel array.

15. The pixel circuit according to claim 1, wherein a method for driving the pixel circuit comprises: driving the pixel circuit in alternate display phase and photographing phase, wherein the display phase comprises a reset sub-phase, a writing sub-phase, and a light-emitting sub-phase, and driving the pixel circuit through the display phase comprises: in the reset sub-phase, resetting, by the reset sub-circuit, the driving sub-circuit; in the writing sub-phase, writing, by the writing sub-circuit, a data voltage into the driving sub-circuit; and in the light-emitting sub-phase, providing, by the driving sub-circuit, driving current for causing the light-emitting device to emit light to the light-emitting device; and driving the pixel circuit through the photographing phase comprises: collecting, by the detection circuit, an incident light and outputting a collection result to the read signal line.

16. The pixel circuit according to claim 8, wherein the compensation sub-circuit is further connected to a first power supply voltage terminal and a second enabling signal terminal, and is configured to output a voltage at the first power supply voltage terminal to the driving sub-circuit under the control of the second enabling signal terminal, and the compensation sub-circuit comprises an eighth transistor, and wherein the eighth transistor has a gate connected to the second enabling signal terminal, a first electrode connected to the first power supply voltage terminal, and a second electrode connected to the driving sub-circuit.

* * * * *